United States Patent
Iihola et al.

(10) Patent No.: US 9,412,934 B2
(45) Date of Patent: Aug. 9, 2016

(54) MICROELECTROMECHANICAL RESONATOR

(71) Applicant: MURATA ELECTRONICS OY, Vantaa (FI)

(72) Inventors: Antti Iihola, Helsinki (FI); Ville Kaajakari, Pasadena, CA (US); Jarmo Kemppainen, Helsinki (FI); Pasi Kivinen, Kirkkonummi (FI); Risto Mourujärvi, Perttula (FI); Marcus Rinkiö, Rajamäki (FI)

(73) Assignee: MURATA MANUFACTURING CO., LTD., Kyoto (JP)

( * ) Notice: Subject to any disclaimer, the term of this patent is extended or adjusted under 35 U.S.C. 154(b) by 441 days.

(21) Appl. No.: 13/897,591

(22) Filed: May 20, 2013

(65) Prior Publication Data

US 2014/0339963 A1    Nov. 20, 2014

(51) Int. Cl.
| | |
|---|---|
| H01L 21/00 | (2006.01) |
| H01L 41/39 | (2013.01) |
| H03H 3/007 | (2006.01) |
| H03H 9/02 | (2006.01) |
| H03H 9/24 | (2006.01) |

(52) U.S. Cl.
CPC ............ *H01L 41/39* (2013.01); *H03H 3/0076* (2013.01); *H03H 9/02259* (2013.01); *H03H 9/2457* (2013.01); *H03H 2009/02291* (2013.01); *H03H 2009/02322* (2013.01); *H03H 2009/02496* (2013.01)

(58) Field of Classification Search
CPC .............................................. H01L 2924/1461
USPC ...................................... 438/49–54
See application file for complete search history.

(56) References Cited

U.S. PATENT DOCUMENTS

| | | | |
|---|---|---|---|
| 8,680,955 B1 * | 3/2014 | Hammond | ............ B81B 7/0019 |
| | | | 200/181 |
| 2011/0305120 A1 | 12/2011 | Hessler et al. | |
| 2012/0286903 A1 | 11/2012 | Prunnila et al. | |

FOREIGN PATENT DOCUMENTS

WO    2012/110708 A1    8/2012

OTHER PUBLICATIONS

Finnish Search Report dated Mar. 11, 2014 corresponding to Finnish Patent Application No. 20135601.
Mohsen Shahmohammadi et al., "Turnover Temperature Point in Extensional-Mode Highly Doped Silicon Microresonators", IEEE Transactions in Electron Devices, vol. 60, No. 3, Mar. 2013, pp. 1213-1220.
H. Zhu et al., "Crystallographic and Eigenmode Dependence of TCF for Single Crystal Silicon Contour Mode Resonators", Micro Electro Mechanical Systems (MEMS), Jan. 20-24, 2013, pp. 761-764.
Antti Jaakkola et al., "Temperature Compensated Resonance Modes of Degenerately n-doped MEMS Resonators", VTT Technical Research Centre of Finland, XP032205275, May 21, 2012, pp. 1-5.
International Search Report application No. PCT/IB2014/061482 dated Sep. 2, 2014.

* cited by examiner

*Primary Examiner* — Brook Kebede
(74) *Attorney, Agent, or Firm* — Squire Patton Boggs (US) LLP

(57) ABSTRACT

A method for manufacturing microelectromechanical flexural resonators with a deforming element that has an elongate body extending along a spring axis. A deforming element is positioned on the semiconductor wafer with a defined nominal n-type doping concentration such that a crystal orientation angle is formed between the spring axis of the deforming element and a crystal axis of the silicon semiconductor wafer. The combination of the crystal orientation angle and the nominal n-type doping concentration is adjusted to a specific range, based on total frequency error of the deforming element in a broad temperature range. The combination is optimized to a range where also sensitivity to variations in the material properties is minimized.

7 Claims, 7 Drawing Sheets

MICROELECTROMECHANICAL RESONATOR

FIELD OF THE INVENTION

The present invention relates to mechanical resonators and especially to a method and a microelectromechanical resonator, as defined in the preamble of the independent claim.

BACKGROUND OF THE INVENTION

Micro-Electro-Mechanical Systems, or MEMS can be defined as miniaturized devices that combine electrical and mechanical components. A microelectromechanical device typically comprises a mechanical element and an electrostatically or electromagnetically operated element, or a directly electromechanical element. MEMS devices can sense, control, and activate mechanical processes on the micro scale, and function individually or in arrays to generate effects on the macro scale.

MEMS devices can be applied to quickly and accurately detect or generate forces through very small deformations in an incorporated mass structure. For example, in electronic frequency reference applications, an electronic voltage may be used to induce a vibration in a specifically designed crystal structure. This vibration generates a corresponding output voltage with high spectral purity and stability. The mass structure exhibits resonance or resonant behavior by naturally vibrating or oscillating at some frequencies, called its resonant frequencies, with greater amplitude than at others. Mass structures deforming (vibrating, oscillating, deflecting, or otherwise exhibiting resonant behavior) in some way in a microelectromechanical device are thus herein referred to as resonators.

Conventionally, a popular technology for manufacturing frequency references has been based on quartz crystal resonators. Recent developments have, however, shown that as an enabler of component miniaturization and fabrication compatibility, silicon can eventually replace quartz in resonator structures. A primary performance characteristic of a frequency reference is stability of the generated signal. In the art, medium-term stability has been characterized to refer to changes in time-intervals of seconds to hours. Medium-term stability is dominated by temperature sensitivity, and its control is one of the most important tasks to ensure required frequency reference performance.

It has been detected that resonators with very little temperature drift, or even overcompensating resonators can be achieved by essentially homogeneously doping the deforming element with a substantial concentration on n-type doping agent. For example, document FI20115151 discloses an extensional mode beam resonator where the resonance is characterized by contraction or extension of the resonator. The document illustrates how a first order (linear) temperature coefficient of frequency (TCF) changes as the orientation of the beam resonator in respect the crystal direction changes.

It has, however, been detected that these theoretical models of prior art do not, as such, work accurately enough for practical implementations. This is especially true for resonators where the resonance is characterized by in-plane and out-of-plane flexing of the resonator. The prior art suggests to use in-plane rotation angles that zero the theoretical linear TCF curves of the first order. In the presented curves, the first order linear TCF is zeroed in approximately 21 degrees deviation from [100] crystal direction, and even higher degree optimal deviations are anticipated for high dopant concentrations. However, the frequency stability provided by the predicted optimal combinations of doping concentrations and >22 degree crystal orientations have not proved to provide adequate accuracy for industrial applications. The control of medium-term stability in flexural mode resonators seem to include various complexities than cannot be controlled by the theoretical predictions of the prior art.

One method of dealing with such complexities is suggested in a prior art document FI20115465. It proposes to manage overall temperature sensitivity properties by including in the resonator at least two types of regions having different material properties, whereby the combination of materials define an effective material. The material properties and the relative volumes are adjusted to provide desired temperature compensation characteristics such that temperature coefficients of the different regions compensate each other. It is, however, understood that without thorough understanding on monostructure behavior, it is very difficult to design and manufacture such mufti-region configurations in practice. In addition, when dealing with microscale elements, the impact of even small tolerances in the material properties, doping concentrations and element orientations are very difficult to control with required accuracy.

BRIEF DESCRIPTION OF THE INVENTION

The object of the present invention is to provide improved flexural mode resonators for microelectromechanical devices. The objects of the present invention are achieved with a method, a resonator and a microelectromechanical device according to the characterizing portions of the independent claims.

The preferred embodiments of the invention are disclosed in the dependent claims.

The present invention is based on a defined range of n-doping concentration and silicon crystal orientation combinations where the error caused by frequency-temperature characteristic of a resonator in flexural mode is minimized, and at the same time sensitivity to deviations from the nominal values remains surprisingly small. Accordingly, an accurate and robust resonator configuration is achieved.

BRIEF DESCRIPTION OF THE FIGURES

In the following the invention will be described in greater detail, in connection with preferred embodiments, with reference to the attached drawings, in which.

DETAILED DESCRIPTION OF SOME EMBODIMENTS

The following embodiments are exemplary. Although the specification may refer to "an", "one", or "some" embodiment(s), this does not necessarily mean that each such reference is to the same embodiment(s), or that the feature only applies to a single embodiment. Single features of different embodiments may be combined to provide further embodiments.

In the following, features of the invention will be described with a simple example of a device architecture in which various embodiments of the invention may be implemented. Only elements relevant for illustrating the embodiments are described in detail. Various implementations of microelectromechanical devices and their manufacturing processes comprise elements that are generally known to a person skilled in the art and may not be specifically described herein.

A microelectromechanical device refers here to a semiconductor structure that comprises a mechanically deforming element and associated electromechanical transduction means to convert energy between the electrical and mechanical domains. The deforming element consists of a continuum of body particles, the configuration of which may change during deformation, and then recover back to the original form. Deformations act as manifestations of energy applied on the deforming element. Elastic deformations of solid objects typically tend to oscillate and resonate with frequencies and amplitudes specific to their material properties.

A transducer, on the other hand, converts one form of energy to another. With an electromechanical transducer it is possible to sense mechanical forces acting on a deforming element by generating or modulating electrical signals according to changes in the dimensions of the deforming element. On the other hand, the electromechanical transducer may be used to actuate the deforming element by converting external electrical energy into motion that acts on the deforming element. The electromechanical transducer may comprise, for example, electrodes arranged to move with the deforming element, or a piezoelectric layer arranged to deform with the deforming element. This combination of a deforming element and an associated transducer is herein referred to as a resonator. Resonators can be used in a microelectromechanical device to sense, control, and activate mechanical processes on the micro scale, or function individually or in arrays to generate effects on the macro scale. The bulk of the resonator body typically consists of the deforming element and many of the oscillation characteristics of the resonator may be controlled by adjusting properties of the deforming element.

Figure 1:
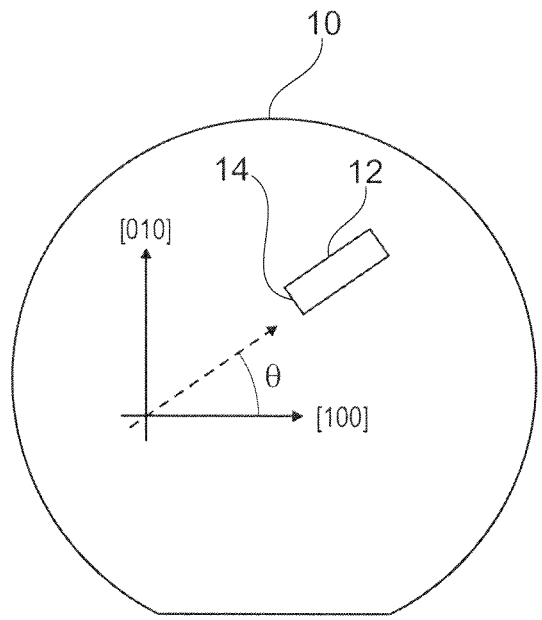
FIG. 1 illustrates a semiconductor wafer for manufacture of resonators of microelectromechanical devices.

FIG. 1 illustrates a semiconductor wafer 10 that can be used in manufacture of resonators for microelectromechanical devices. A wafer refers here to a planar element of crystalline semiconductor material. The wafer may be, for example, sliced from a cylindrical ingot of high purity monocrystalline semiconductor, such as silicon. In the embodiments of the invention, considerable amounts of n-type donor impurity atoms may be added to the molten intrinsic material to provide a strong excess of negative electron charge carriers in the crystal. In the embodiments, the wafer typically has a nominal n-type doping concentration that is used to characterize the semiconductor wafer in the whole. The material of the wafer has a unique crystal structure, and at slicing the plane of the wafer surface is typically aligned in one of crystal orientations of the semiconductor material. Hereinafter, Miller indices are used to notate planes in silicon crystal lattices. FIG. 1 illustrates an exemplary silicon wafer 10 with a diamond cubic structure and orientation of the [100] and [010] crystal axes of the silicon wafer, defined by means Miller indices. The plane of the silicon wafer of FIG. 1 is aligned with a (001) plane (a {100} equivalent plane) of the silicon.

FIG. 1 also shows a possible orientation of dimensions of a deforming element 12 of a flexural mode resonator in respect of the crystal orientation in the plane of the silicon wafer 10. At manufacturing, dimensions of the deforming element may be formed, for example by means of photolitography and etching, from the silicon wafer. The deforming element 12 may modeled with a mechanical structure that comprises an elongate body, in one end of which is an anchor point 14, in respect of which the deforming element may fixed to oscillate during operation. At rest, the body extends essentially linearly along its length dimension. When forces act upon the mass of the body, it may flex from its linear form. Accordingly, the direction of the length dimension of the body forms a spring axis.

The deforming element may be further modeled and/or implemented as a combination of a spring structure and a seismic mass such that in one end of the deforming element is the anchor point, in the other end of the deforming element is a seismic mass, and between these ends extends a spring structure that is essentially linear at rest. During operation, the anchor point may be rigidly fixed to a support structure and can be considered to maintain a constant position and thereby provide a reference point to the deformations of the deforming element. The seismic mass is an object with mass upon which a force can act and cause the mass to change its velocity. The spring is an elastic element that is fixed to the anchor point and the seismic mass, and its endpoints form a spring axis of the deforming element. The flexural mode refers here to flexure or bending of the spring in response to a force transverse to the spring axis.

The flexural mode may include in-plane flexures where the body or the spring anchored from its one end deflects in the direction of the plane of the silicon wafer. The flexural mode may also include out-of-plane flexures where the body or the anchored spring deflects transversely to the direction of the plane of the silicon wafer.

Figure 2A:
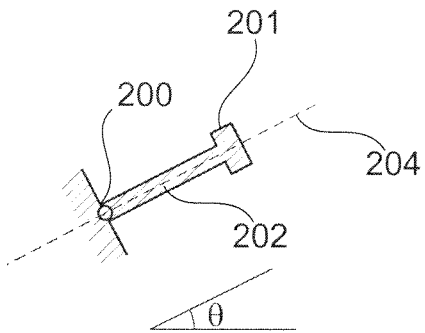
FIGS. 2A to 2C illustrate exemplary configurations and orientations of a deforming element.
Figure 2B:
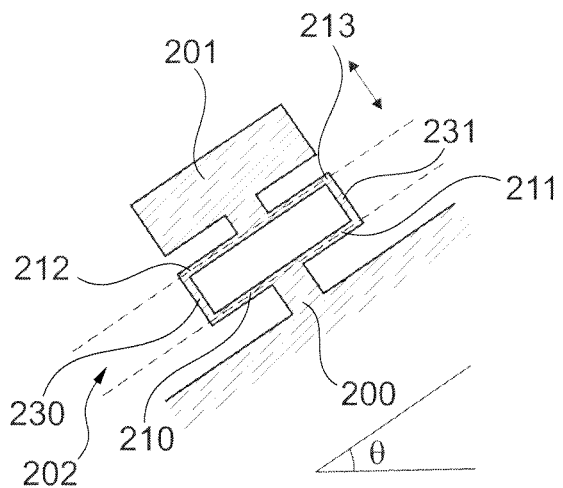
Figure 2C:
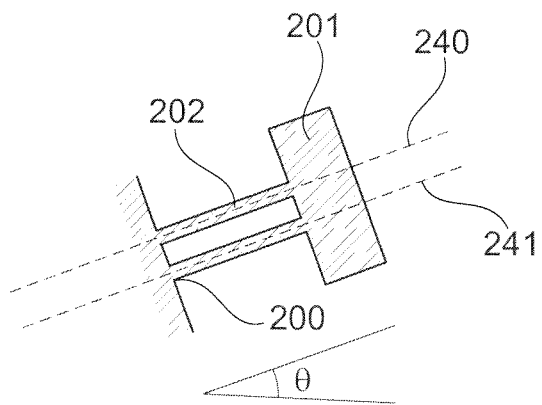

FIGS. 2A to 2C illustrate exemplary configurations and orientations of a deforming element of FIG. 1. FIG. 2A illustrates a deforming element that comprises an anchor point 200, a seismic mass 201 and a spring structure 202, implemented as a beam. The length of the beam is several times longer than its width and thickness, and the beam extends longitudinally along a spring axis 204. The length of the beam may be at least three times longer than its width and thickness. For added mobility, the length of the beam may be more than ten times longer than its width and thickness.

A crystal orientation angle θ of the deforming element denotes here the orientation of the beam in respect of a <100> crystal axis of silicon (Miller indices applied). As an example, if the wafer surface is aligned with a (001) plane of the semiconductor material wafer, the spring axis is aligned with the plane of the wafer and the crystal orientation angle θ shows as the angle between the spring axis and a [100] crystal axis in the plane of the silicon wafer. When θ=0, the deforming element is aligned along the [100] axis. When the orientation of the beam of the spring in the plane of the wafer is changed, the deforming element is offset from the [100] axis, and angle θ is formed between the beam axis and the [100] crystal axis. When θ=45, the deforming element is aligned along the [110] crystal axis. It is noted, however, that the wafer surface may be aligned to any plane of the silicon crystal. The crystal orientation angle θ is defined in relationship to the <100> crystal axis of the silicon crystal lattice, notwithstanding whether it coincides with the wafer surface or not.

FIG. 2B illustrates another configuration that comprises an anchor point 200, a seismic mass 201 and a spring structure 202, implemented as a folded beam. The folded beam may be considered to be formed of four interconnected beams 210, 211, 212, 213, wherein the length of each of the beams is again several times longer than its width and thickness. At rest, the beams 210, 211, 212, 213 extend longitudinally along their respective spring axes 220, 221, 222, 223. As shown in FIG. 2B, two of the spring axes coincide. The beams 210, 211 may be considered to be anchored to the anchor point 200, and beams 212, 213 may be considered to be anchored to points 230, 231 of their interconnection to beams 210, 211, respectively. When the seismic mass moves in the direction shown with the arrows, the beams 210, 211 may be considered to flex in-plane between the anchor point 200 and the points 230, 231 of interconnection. Correspondingly, the beams 212, 213 may be considered to flex in-plane between the points 230, 231 of interconnection and the seismic mass 201.

FIG. 2C illustrates a further configuration that comprises an anchor point 200, a seismic mass 201 and a spring structure 202 with spring axes 240, 241. Here the spring is formed of two parallel beams, both fixed to the anchor point and the seismic mass. FIG. 2C shows also the spring axis 204 of this configuration. It is noted that the structures of FIGS. 2A to 2C are exemplary; other corresponding configurations may be applied within the scope of protection.

The frequency-temperature characteristic of a resonator defines how its resonant frequency varies in response to changes in temperature. The frequency-temperature characteristic is typically quantified by temperature coefficients of frequency (TCF). It is known that a large n-type doping concentration in the order of $10^{19}$ cm$^{-3}$ can significantly reduce a first order TCF of a resonator made of silicon. The prior art suggests that by optimizing the resonator orientation with respect to silicon crystal orientation and the doping concentration, the linear TCF can be adjusted to zero or some other desired level. Simple zeroing of the linear TCF has, however, not proved to be feasible for most of the actual applications.

Firstly, the theoretical linear TCF curves suggest use of in-plane rotation angles that tend to be too high for practical implementations of flexural resonators. In theory, the frequency dependency of the one-dimensional Young's modulus can be considered to be the same for in-plane, out-of-plane flexural-beam and length extensional mode-resonators. Earlier all these resonators have been deemed to have the same TCF and vary similarly as a function of n-doping and rotation angle. It has, however, been noted that these assumptions may be valid for the length extensional mode beam resonators, but the TCFs of the flexural mode resonators are not purely one dimensional in respect to a chosen crystal axis. The Young's moduli of the flexural resonators are dependent on the combination of several crystal angle orientations due to finite bending of the spring along its body and anchoring forces on the spring body.

In addition, it is evident that the doping level of a semiconductor wafer from which the deforming elements are manufactured can only be determined with limited accuracy. Commercially available wafers are typically featured with minimum/maximum resistivity levels (Ωm). There are some general practices for conversion between resistivity and dopant density values of essential semiconductor materials, but typically only approximate nominal values are available for manufacture. It is also known that formation of the crystal ingot requires precise control of the temperature gradients, rate of pulling and speed of rotation, and that variation of doping concentration within ingot may be or the order of tens of percent from the estimated nominal value. These problems could, in theory, be overcome by reducing tolerances in crystal and wafer manufacture, or by accurately measuring properties of each semiconductor wafer before it is fed to manufacturing processes. It is, however, evident that such operations can only be made to an extent and with a high associated cost. For true industrial level processes, improved dimensioning is needed.

A deforming body can be dimensioned and anchored in numerous ways, which leads to a variety of ways for the resonator to bend in respect of the anchoring point. The inventors have, however, found that there exists an unexpected range of n-doping concentration and silicon crystal orientation combinations where the total frequency error caused by frequency-temperature characteristic of a resonator in flexural mode is minimized, and at the same time sensitivity to deviations from the nominal values is small.

Figure 3:
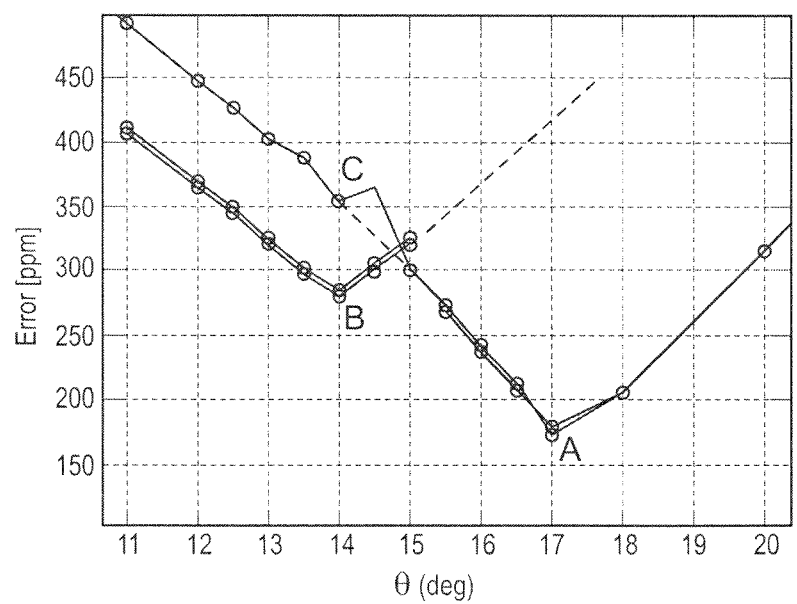
FIG. 3 illustrates measured values of total frequency error in deformation as a function of crystallographic rotation angle θ for two exemplary doping concentrations.

FIG. 3 illustrates measured values of total frequency error in deformation as a function of crystal orientation angle θ for two exemplary doping concentrations. The total frequency error represents herein overall temperature drift of in-plane flexural or out-of-plane flexural mode vibrations of a deforming element in an exemplary operational temperature range of −40 to +85 degrees Celsius. The total frequency error may be calculated by first estimating thermal dependency of the frequency error for a specific doping concentration and crystal orientation. The total frequency error for each specific configuration may be considered to correspond with the largest difference in frequency to the frequency at the reference temperature over the whole operational temperature range. It is noted that the selected operational temperature range is exemplary; some other range may be applied within the scope of protection. However, the resonator design should not be a critical factor in design of the microelectromechanical device, so a broad operational temperature range is typically preferred. The reference temperature applied herein is 25 degrees Celsius and the total frequency error is depicted as a function of crystal orientation angle θ between the spring axis of the deforming element and a [100] crystal axis in the plane of the silicon wafer, as shown in FIG. 1.

It has now been found that with flexural resonators, the measured crystal orientation angles θ that provide a minimum total frequency error deviate significantly from the optimal values suggested by prior art. The prior art applies doping concentrations in the order of $1.8 \cdot 10^{19}$ cm$^{-3}$ to $5 \cdot 10^{19}$ cm$^{-3}$ and shows that, for example, the optimal in-plane rotation angle that zeroes the linear TCF with $5 \cdot 10^{19}$ cm$^{-3}$ doping concentration level is of the order of 22 degrees. FIG. 3 shows that for a flexural resonator, the measured total frequency error value with $4.4 \cdot 10^{19}$ cm$^{-3}$ doping concentration level is at its minimum already at 14 degree angles. With the doping concentration levels lower than $2 \cdot 10^{19}$ cm$^{-3}$, only total frequency error levels beyond 400 ppm can be achieved.

It has also been found that the difference between the total frequency errors for different doping concentrations may change quite strongly for different angles. For example, when θ is 14°, the total frequency error with the lower doping concentration 4.4·10$^{19}$ cm$^{-3}$ is at its minimum (denoted with B) ~290 ppm. With the higher doping concentration 7.1·10$^{19}$ cm$^{-3}$, the total frequency error at that crystal orientation is of the order of 350 ppm (denoted with C). When the angle is ~14.8 degrees the total frequency error stays below 310 ppm even if the doping concentration varies from 4.4·10$^{19}$ cm$^{-3}$ to 7.1·10$^{19}$ cm$^{-3}$. The difference of total frequency error between points B and C is thus relatively small, which means that deviations in the doping concentration have only a finite effect to the total frequency error. In comparison, for example, when θ is of the order of 17 degrees, the total frequency error with the higher doping concentration 7.1·10$^{19}$ cm$^{-3}$ is at its minimum (denoted with A) ~180 ppm. With the lower doping concentration 4.4·10$^{19}$ cm$^{-3}$, the total frequency error with the 17 degree angle is already much higher.

Figure 4:
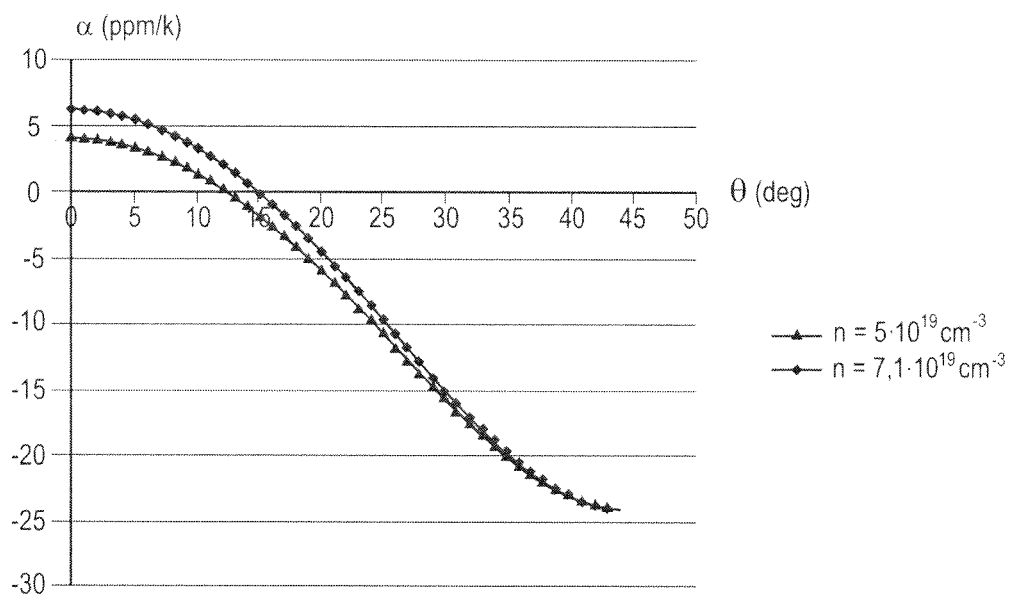
FIG. 4 illustrates an exemplary first order TCF as a function of resonator orientation θ for the two different doping concentrations.
Figure 5:
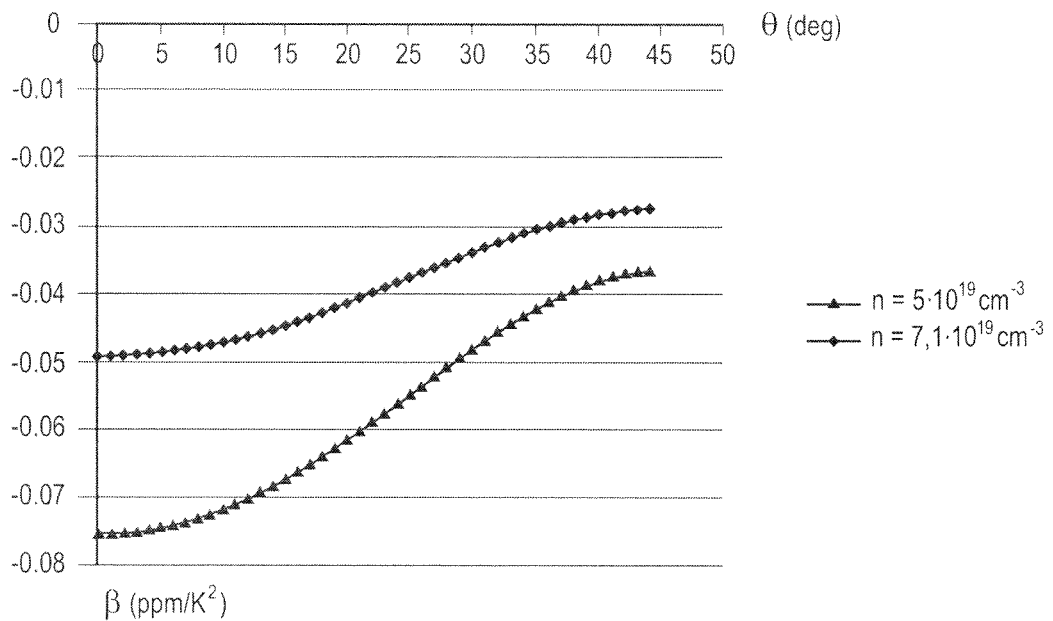
FIG. 5 illustrates an exemplary second order TCF as a function of resonator orientation θ for the two different doping concentrations.

The frequency error of a flexural mode resonator depends on the first and second order TCFs. The frequency error can therefore be expressed as:

$$\frac{\Delta f}{f} = \alpha \Delta T + \beta \Delta T^2 \qquad (1)$$

where α is the first order TCF, β is the second order TCF, and ΔT is the temperature change from a reference temperature. In order to estimate the overall frequency error of different structures, behavior of the first order TCF α and the second order TCF β must be considered. FIG. 4 illustrates a first order TCF as a function of resonator orientation θ in a {100} plane for the two different strong n-doping concentrations in the broad operational temperature range of FIG. 3. FIG. 5 illustrates a corresponding exemplary second order TCF as a function of resonator orientation θ for the two different doping concentrations. The found optimal range is based on new understanding on the combined overall behavior of the first and second order TCFs in view of the doping concentration and the crystal orientation of the deforming element.

Furthermore, it is also seen that the range where the total frequency error is low enough for industrial applications and also insensitive to deviations in the doping concentration is very limited. For example, with the higher doping concentration 7.1·10$^{19}$ cm$^{-3}$, the measured total frequency error is at minimum (denoted with A) when θ is of the order of 17 degrees. At that point the curve of the lower doping concentration has already passed its minimum and rises very quickly. Outside a very limited range of crystal orientations where applicable concentration levels reach their minima, deviations in concentration or resonator dimensions generate a very large total frequency error. It is noted that the depicted curves include measured and/or simulated values for exemplary strongly doped silicon crystal material. They are provided here to illustrate the complex dependencies between the angles, doping concentrations and their effect to the total frequency error.

The invention is based on the finding that the optimal combinations of crystal orientation and doping concentration values are in a limited range that is far below the values suggested in the prior art. It has been further detected that within that same range, deviations from the nominal values of crystal orientation and doping concentration in a semiconductor wafer have surprisingly a reduced effect to the total temperature drift of deformation of the deforming element. Applicable nominal value combinations may thus be selected from that range, and the total frequency error caused by deviated value combinations of crystal orientation and doping concentration in a semiconductor wafer remains safely below a predefined error threshold value.

Figure 6:
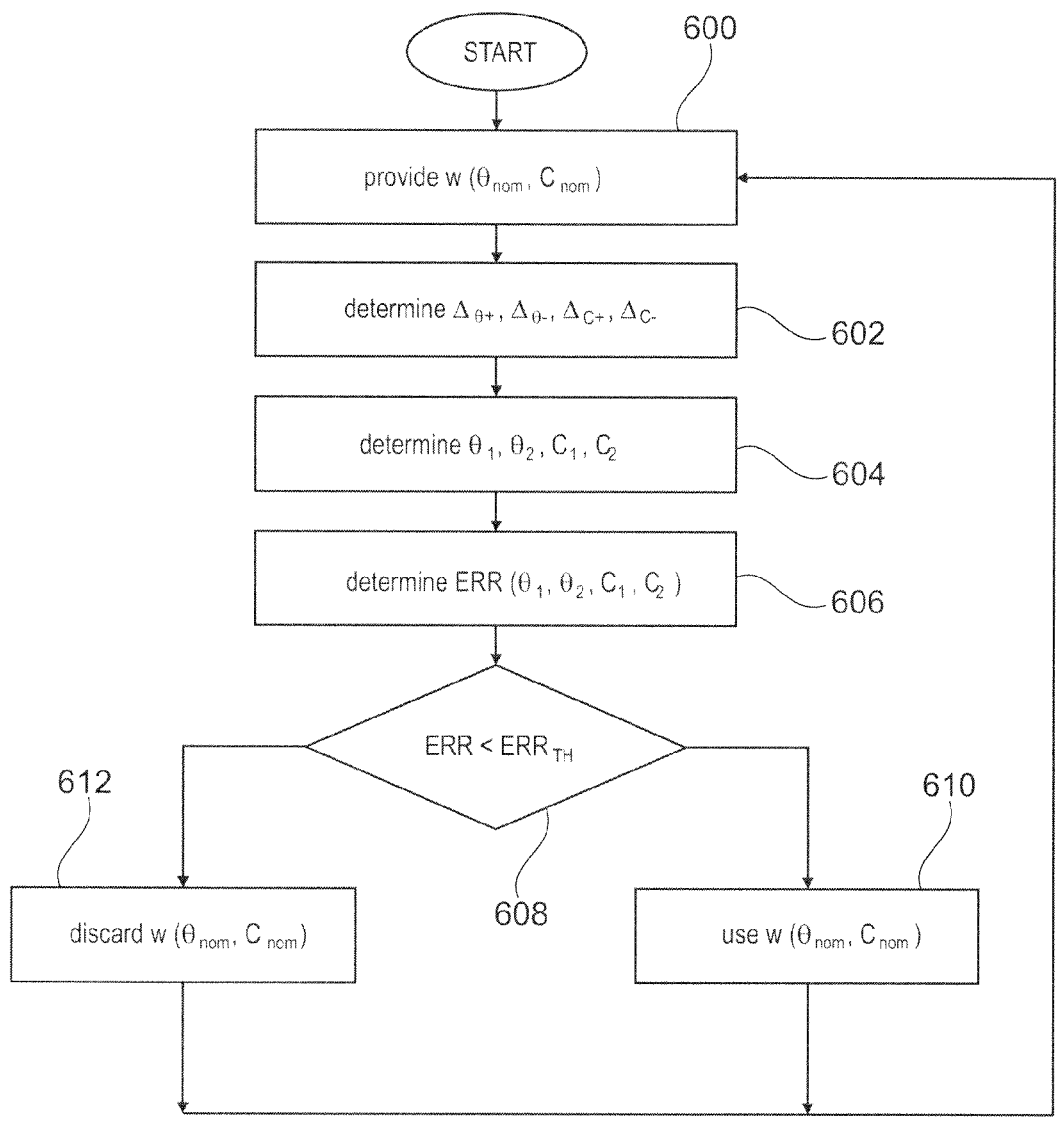
FIG. 6 illustrates stages of an embodiment of a method for manufacturing microelectromechanical resonators according to the invention.

FIG. 6 illustrates stages of an embodiment of a method for manufacturing microelectromechanical resonators according to the invention. The method begins by providing (stage 600) a semiconductor wafer w with a nominal crystal orientation θ$_{nom}$ and a nominal n-type doping concentration C$_{nom}$. The semiconductor wafer refers here to a single planar element of manufacture, in the plane of which one or more microelectromechanical resonators may be formed in parallel. The semiconductor wafer material has a specific crystalline structure and the plane of the semiconductor wafer is aligned with one of crystal orientations of the semiconductor material. As an example, let us assume that in the present embodiment, the semiconductor wafer is a silicon wafer with a diamond cubic structure and in the (001) plane of the semiconductor wafer, orientations of [100] and [010] crystal axes are as shown in FIG. 1. In the example, the nominal crystal orientation is quantified with a crystal orientation angle θ that is formed between the direction of a spring axis of the deforming element of the resonator and the [100] crystal axis in the plane of the silicon semiconductor wafer.

The nominal n-type doping concentration is a design parameter that is considered to apply to the semiconductor wafer as a whole. Doping refers to impurities intentionally introduced into an intrinsic semiconductor material to change its electrical properties. The doping concentration is typically expressed as the minimum concentration of a specific type of doping agent in the semiconductor material. In the example, the nominal doping concentration is quantified by the minimum concentration of n-type doping agent, like phosphorus, antimony or arsenic, for example, in the silicon semiconductor material. The concentrations of n-type doping agents in temperature drift-controlled structures advantageously vary in the >10$^{19}$ cm$^{-3}$ range.

As may be understood, the nominal values are averaged values used to characterize the whole semiconductor wafer. As discussed earlier, actual values of doping concentration in different positions in the plane of the wafer may deviate from the nominal values in the order of tens of percent. In addition, the actual values of crystal orientation may also deviate from the nominal design value. During the growth of the ingot, the direction of the crystal aligns with the seed. However, it is possible that the crystal orientation is slightly misaligned in respect of the normal to the plane of the wafer because the ingot has not been absolutely vertically directed during the growth, and/or that the slicing of the wafers has not been absolutely horizontal in respect of the ingot. It is also possible that the flat of the wafer is misaligned in some stage of silicon on insulator (SOI) process or cutting of the flat is not absolutely correct. It may also happen that orientation of the mask during manufacture of the resonators is not absolutely accurate. Accordingly, deviations from the nominal values of the crystal orientations in the semiconductor wafer may need to be considered as well, even if they typically are smaller than deviations in the doping concentration.

Thus, the next step includes determining (stage 602) in the provided semiconductor wafer a maximum positive deviation Δ$_{θ+}$ and a maximum negative deviation Δ$_{θ-}$ from the nominal crystal orientation, as well as a maximum positive deviation Δ$_{C+}$ and a maximum negative deviation Δ$_{C-}$ from the nominal concentration in the semiconductor wafer. The maximum deviations from the nominal values may be determined by measuring characteristics of the provided semiconductor, estimated on the basis of earlier measurement results with similar semiconductor wafers, estimated theoretically, or adopted from tolerances provided by semiconductor wafer manufacturers. The maximum deviations may also be determined with a combination of at least some of these mechanisms. Depending on materials, positive and negative maximum deviations may by equal, or differ from each other. In the present example, the nominal value for the doping concentration in the semiconductor wafer is given as the minimum concentration of n-type doping agent. This means that in the example, the maximum negative deviation $\Delta_{C-}$ may be considered to be zero, and the maximum positive deviation $\Delta_{C+}$ has a non-zero value.

When the nominal values and possible deviations from the nominal values are known for the provided semiconductor wafer, it is possible to determine (stage 604) extreme values of crystal orientation $\theta1$, $\theta2$ and extreme values of doping concentration C1, C2 for it. An extreme value corresponds here with a sum of a nominal quantity and a maximum deviation from said nominal quantity. Accordingly:

$$\theta1=\theta_{nom}+\Delta_{\theta+}$$

$$\theta2=\theta_{nom}-\Delta_{\theta+}$$

$$C1=C_{nom}+\Delta_{C+}$$

$$C2=C_{nom}-\Delta_{C-}$$

Figure 7:
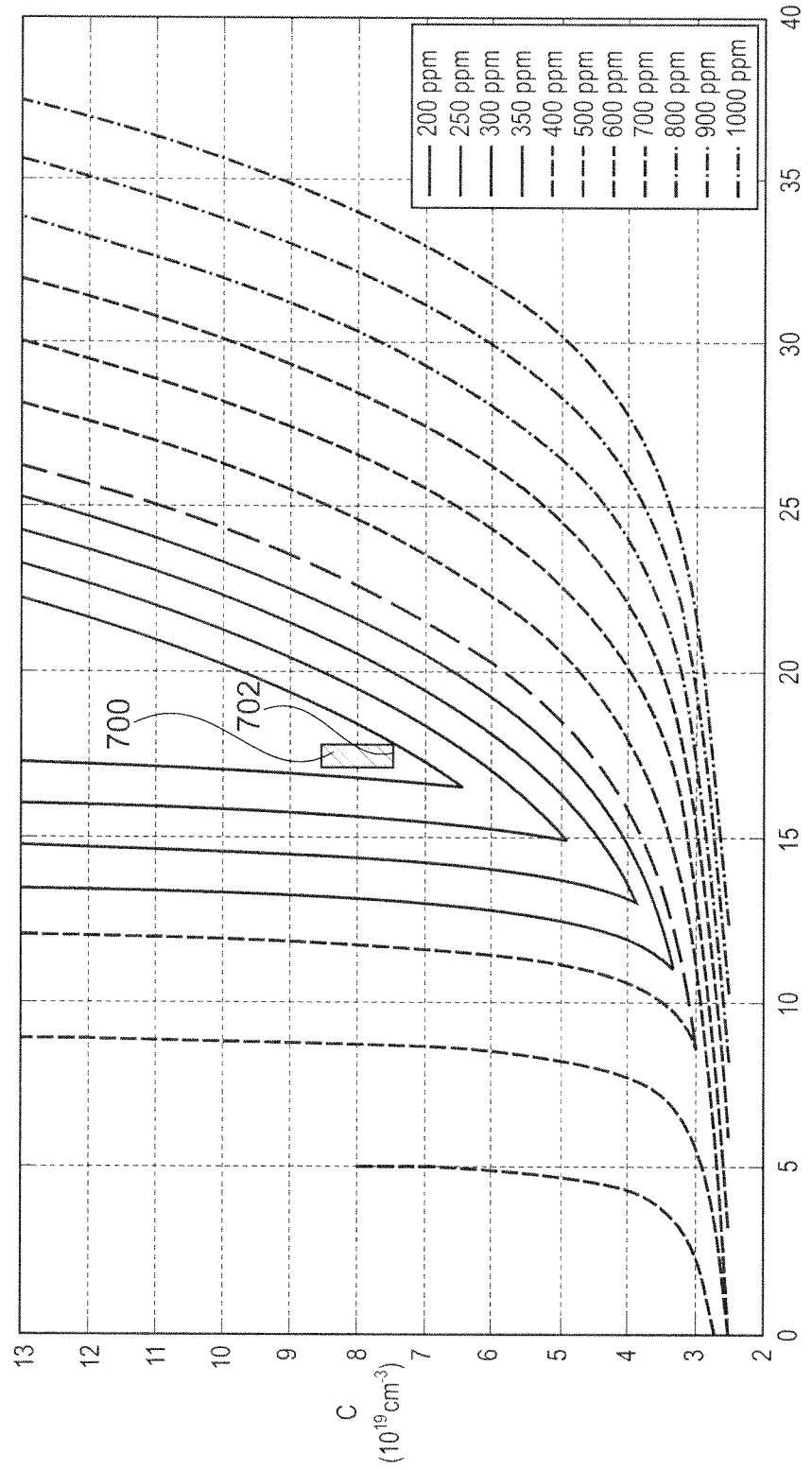
FIG. 7 illustrates exemplary total frequency error potential curves defined for the semiconductor wafer of FIG. 1.

As discussed above, the effect of deviations $\Delta_{\theta+}$, $\Delta_{\theta-}$, $\Delta_{C+}$ and $\Delta_{C-}$ to the total frequency error of the temperature drift may vary according to the combination of nominal values in the semiconductor wafer. Through simulations and/or measurements it is, however, possible to determine values for the total frequency error for different value combinations. FIG. 7 illustrates exemplary total frequency error potential curves defined for the semiconductor wafer of FIG. 1. The region between two similar curves in FIG. 7 includes combinations of crystal orientation and doping concentration with which the total frequency error remains lower than a denoted threshold level. The total frequency error curves in this example have been generated for a selected design temperature range of −40 . . . +85 degrees Celsius, but some other temperature range may be applied without deviating from the scope of protection.

In the method of FIG. 6, one can thus determine (stage 606) the total frequency error ERR($\theta1$, $\theta2$, C1, C2) for each of the extreme value combinations ($\theta1$, C1), ($\theta1$, C2), ($\theta2$, C1) and ($\theta2$, C2) and use these total frequency error values to decide (stage 608) whether the error ERR($\theta1$, $\theta2$, C1, C2) in each of the extreme values is smaller than a set threshold error level ERR$_{TH}$. If YES, the semiconductor wafer with the nominal doping concentration and the nominal crystal orientation is applicable for manufacture of the microelectromechanical resonators (stage 610), otherwise not (stage 612).

Figure 8:
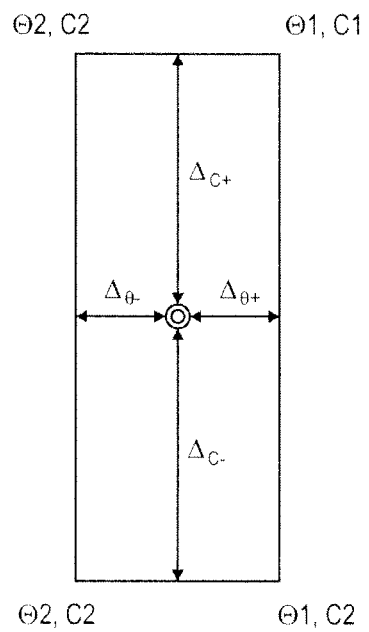
FIG. 8 illustrates how the extreme value combinations (of a particular semiconductor wafer may be depicted as a rectangle.

FIG. 8 illustrates how the extreme value combinations ($\theta1$, C1), ($\theta1$, C2), ($\theta2$, C1) of a particular semiconductor wafer may be depicted as a rectangle. As discussed earlier, in the example, the maximum negative deviation $\Delta_{C-}$ was considered to be zero, whereas the maximum positive deviation $\Delta_{C+}$ has a non-zero value. A rectangle 700 corresponding to this arrangement has been drawn into the error potential curves of FIG. 7. The semiconductor wafer can be used with the nominal crystal orientation for manufacturing micromechanical resonators if the determined values for all extreme value combinations remain below a predefined error threshold value. For a predefined total frequency error threshold, it is thus possible to draw the rectangle for a specific semiconductor wafer type and check whether its boundaries remain within the region of that particular error potential. If they do, the semiconductor wafer with its specific nominal values can be selected for manufacture.

For example, FIG. 7 shows a rectangle 700 that corresponds with material characteristics of an exemplary semiconductor wafer, where the maximum positive deviation $\Delta_{\theta+}$ and the maximum negative deviation $\Delta_{\theta-}$ from the nominal crystal orientation are equal and of the order of 1°. The maximum positive deviation $\Delta_{C+}$ is of the order of $1 \cdot 10^{19}$ cm$^{-3}$ and a maximum negative deviation $\Delta_{C-}$ from the nominal concentration is zero. The nominal values from which the deviations are defined shows as a nominal value point 702 in the bottom of the rectangle. It can be seen that with that specific type of wafer characteristics, already in the lowest 200 ppm total frequency error threshold region, a possible position for the rectangle exists. The nominal value point 702 of the rectangle ($\theta$=17 degrees, c=$7.1 \cdot 10^{19}$ cm$^{-3}$) represents the applicable minimum value for the doping concentration of the wafer and the applicable nominal value for the orientation of the manufactured resonators on the wafer. Specifically, the error potential curves of FIG. 7 also show that for different total frequency error levels, there is a specific dimensioning region, where even larger than expected deviations from the nominal doping concentrations do not essentially increase the total frequency error.

The total frequency error for conventional kHz range tuning fork quartz crystal resonator is typically of the order of 200 ppm. In order to credibly compete with them, the total frequency error with silicon structures should advantageously be in the order of 300 ppm or less. It may be seen from FIG. 7 that based on this criterion, applicable crystal orientation values for flexural mode resonators start from 13 degrees and doping concentration values from about $4.10^{19}$ cm$^{-3}$. The optimal crystal orientation angle in view of both total error and sensitivity to variations in doping concentration is about 14.8 degrees, and as discussed above, the further away the orientation angle increases from the optimal value, the higher doping rates are required to maintain the same level of total frequency error. Typically the price of semiconductor wafers increases with the level of doping concentration. On the other hand, there hardly are practical values beyond a $9 \cdot 10^{19}$ cm$^{-3}$ doping concentration level. Accordingly, it can also be seen from FIG. 7 that the applicable crystal orientation values for flexural mode resonators typically end before 22 degrees. The range of applicable value combinations are in a horn-like area limited by the 300 ppm error potential curve shown in FIG. 7.

Figure 9:
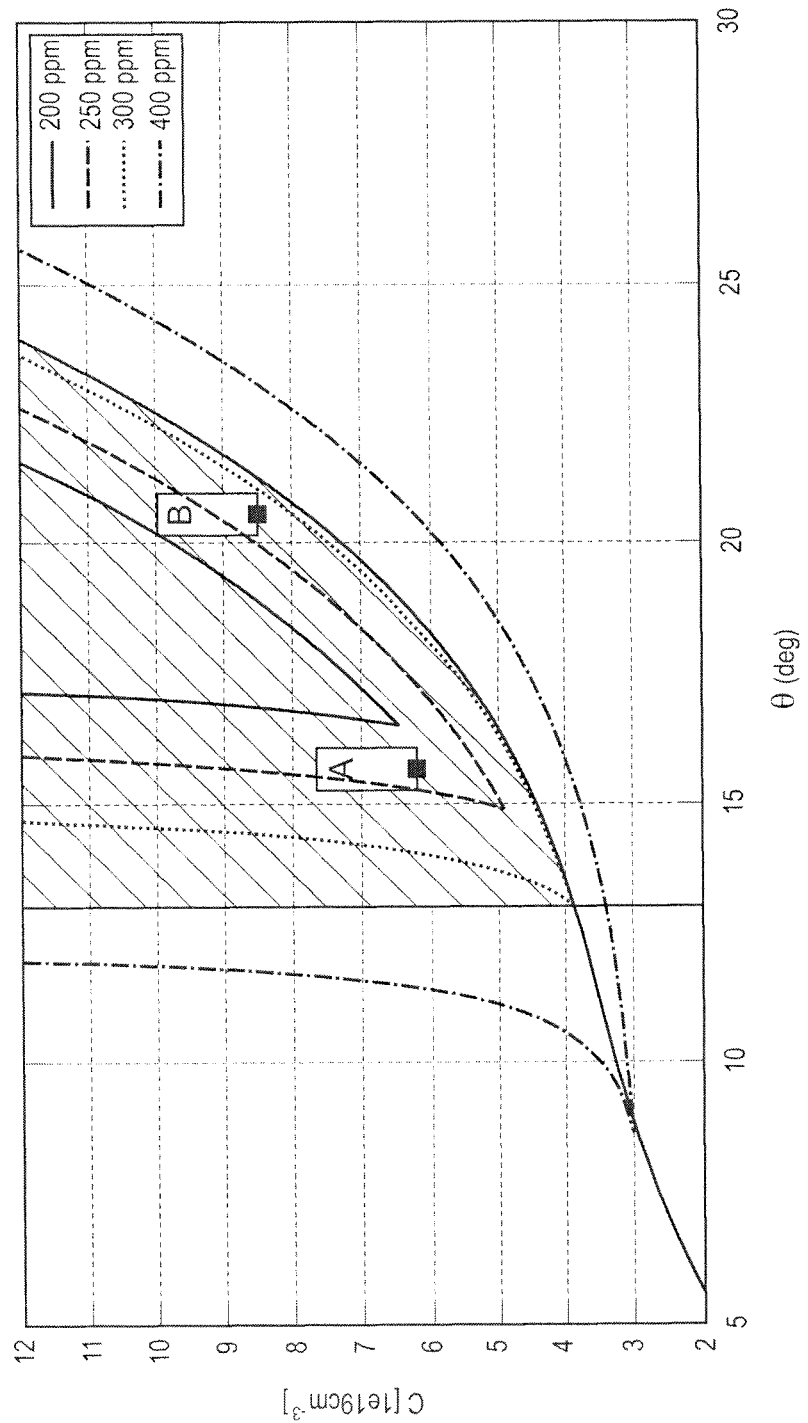
FIG. 9 illustrates the total potential error curves with two rectangles that correspond to a specific type of semiconductor wafer.

FIG. 9 illustrates the range of applicable value combinations in the potential curves of FIG. 7. The applicable range can be approximated, for example, with an area defined by equation (C in units of $1 \cdot 10^{19}$ cm$^{-3}$):

$$C > k1 * \Theta^3 + k2 * \Theta^2 + k3 * \Theta + k4, \text{ when } \Theta \geq 13 \text{ deg}$$

where $k1$=0.0027 deg$^{-3}$ cm$^{-3}$
 $k2$=−0.886 deg$^{-2}$ cm$^{-3}$
 $k3$=1.1667 deg$^{-1}$ cm$^{-3}$
 $k4$=−2.2624 cm$^{-3}$ In practice, the deviations in the crystal orientation are of the order of 0.5 degrees, i.e. relatively smaller than the deviations from the minimum doping concentration. Furthermore, due to the specific form of the potential curves it can be easily seen that in the specific defined range, the upward deviations from the minimum doping concentrations do not drive the total frequency error ERR($\theta1$, $\theta2$, C1, C2) in the extreme values ($\theta1$, C2), ($\theta2$, C2) of the highest doping concentration C2 outside the potential curve. Accordingly, practical dimensioning of the deforming element can be safely done by determining the minimum value C for the n-type doping concentration of the semiconductor wafer, and adjusting the value of the crystal orientation angle $\Theta$ of the deforming element according to this minimum value C for the n-type doping concentration such that the values are in a range formed within the above curves.

FIG. 9 illustrates the total potential error curves of FIG. 7, where two rectangles correspond to the specific type of semiconductor wafer 700 of FIG. 7. FIG. 9 illustrates two different positions for the rectangle in the 300 ppm total frequency error threshold region. The positions illustrate that with knowledge on characteristic variances with specific type of semiconductor wafers and crystal orientations, it is also possible to move the rectangle in a region of predefined total frequency error level to search for a technically and commercially optimal combination of nominal values for the resonator. The potential curves represent applicable ranges of doping concentration and crystal orientation values within which either of the nominal value combinations A or B can be selected for manufacture. The decision may be based on other, potentially even non-technical aspects, without essentially compromising the temperature stability behavior of the overall device design.

FIG. 7 illustrated exemplary total frequency error potential curves, depicted in one 45° interval in the [100] orientation of FIG. 1 (one of <100> family of directions). It should be noted that in silicon crystal symmetry, crystal orientation can be considered to repeat in {100} plane due to silicon symmetry, i.e. a similar effect to the total frequency error may be detected with nominal angles n*90°, where n=1, 2, or 3.

Figure 10:
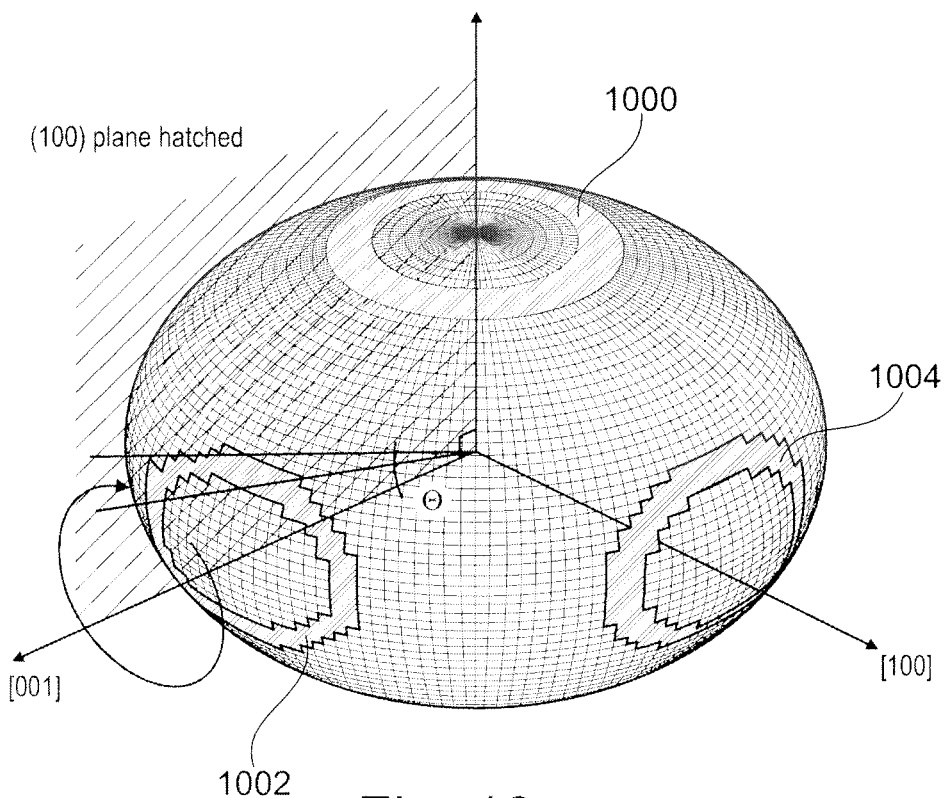
FIG. 10 illustrates orientations for a silicon wafer with a defined doping concentration and cut in (001) plane.

Furthermore, FIG. 7 illustrated the total frequency error potentials for in-plane and out-of-plane flexural mode vibrations of a resonator. FIG. 10 illustrates orientations for a silicon wafer with a defined doping concentration and cut in {100} plane. The three dashed circles 900, 902, 904 represent exemplary optimal ranges for crystal orientation angle θ, within which the total frequency error provided by the combination of the specific doping concentration of the silicon wafer and the crystal orientation angle θ remains below a specific threshold. The figure illustrates that the ranges are rotationally symmetrical in respect of the main crystal axes [100], [010], [001]. The symmetry applies also in negative direction, i.e. in total six optimal ranges for crystal orientation angle θ exist (not shown).

Embodiments of the invention include also a micromechanical resonator 102, for example as the embodiment of FIG. 1 manufactured with the method of FIG. 6. The micromechanical resonator can be differentiated from the prior art solutions in that the combination of the nominal doping concentration and the nominal crystal orientation of a silicon material of the deforming element of the resonator for an announced maximum temperature drift of design is within a corresponding total frequency error potential range disclosed in FIG. 7. As discussed above, the range includes nominal crystal orientation values Θ, and nominal minimum doping concentration values C that are within an area defined by equation:

$$C > k1*\Theta^3 + k2*\Theta^2 + k3*\Theta + k4, \text{ when } \Theta \geq 13 \text{ deg}$$

where k1=0.0027 deg$^{-3}$ cm$^{-3}$
k2=−0.886 deg$^{-2}$ cm$^{-3}$
k3=1.1667 deg$^{-1}$ cm$^{-3}$
k4=−2.2624 cm$^{-3}$ The microelectromechanical resonator is advantageously a frequency reference apparatus, but the invention applies to any kind of microelectromechanical resonators where frequency stability of an incorporated flexural mode resonator is of importance. The micromechanical resonator may be included in a microelectromechanical device, for example, a sensor device, like an accelerometer, an angular rate sensor, or a magnetic field sensor, or an actuator device, like an opto-mechanical device or a switching device.

It is apparent to a person skilled in the art that as technology advances, the basic idea of the invention can be implemented in various ways. For example, the described deforming element may be part of a multi-layer resonator structure. The invention and its embodiments are therefore not restricted to the above examples, but they may vary within the scope of the claims.

The invention claimed is:

1. A method for manufacturing microelectromechanical resonators, wherein a microelectromechanical resonator comprises a deforming element with an elongate body that extends along a spring axis, and the method comprises:
providing a semiconductor wafer that has a nominal n-type doping concentration, a plane of the semiconductor wafer being aligned to a crystal plane of a semiconductor crystal;
positioning the deforming element on the semiconductor wafer such that a crystal orientation angle is formed between the spring axis of the deforming element and a <100> crystal axis of the semiconductor crystal lattice;
determining, for said crystal orientation angle and said nominal n-type doping concentration, a total frequency error value of the deforming element within a defined temperature range; and
manufacturing the deforming element using the crystal orientation angle if the determined total frequency error value is below a predefined error threshold value.

2. A method according to claim 1, wherein the determining comprises determining the value for the total frequency error from the largest difference in frequency to the frequency at the reference temperature over the whole operational temperature range.

3. A method according to claim 1, wherein the providing comprises providing a silicon semiconductor wafer, a plane of which is aligned to a crystal plane of a silicon crystal.

4. A method according to claim 1, wherein the positioning comprises positioning the deforming element on the semiconductor wafer such that predefined error threshold value is 300 ppm and the nominal crystal orientation angle Θ and the nominal n-type doping concentration C of the deforming element in units of 1·10$^{19}$ cm$^{-3}$ are in a range defined by equation:

$$C > k1*\Theta^3 + k2*\Theta^2 + k3*\Theta + k4, \text{ when } \Theta \geq 13 \text{ deg}$$

where k1=0.0027 deg$^{-3}$ cm$^{-3}$
k2=−0.886 deg$^{-2}$ cm$^{-3}$
k3=1.1667 deg$^{-1}$ cm$^{-3}$
k4=−2.2624 cm$^{-3}$.

5. A method according to claim 1, further comprising forming the elongate body such that the dimension of the body along the spring axis is at least three times the dimensions of the body in a direction traverse to the spring axis.

6. A method according to claim 1, further comprising forming the elongate body into a beam, wherein the dimension of the beam along the spring axis is at least ten times the dimensions of the beam in a direction traverse to the spring axis.

7. A method according to claim 5, further comprising anchoring the deforming element via an anchoring point to the microelectromechanical resonator for in-plane or out-of-plane flexure in respect to the plane of the semiconductor wafer.

* * * * *